United States Patent
Trequattrini et al.

(10) Patent No.: US 7,453,264 B2
(45) Date of Patent: Nov. 18, 2008

(54) NUCLEAR MAGNETIC RESONANCE APPARATUS

(75) Inventors: Alessandro Trequattrini, Genoa (IT); Luigi Satragno, Genoa (IT); Eugenio Biglieri, Masio (IT); Stefano Pittaluga, Genoa (IT)

(73) Assignee: Esaote, S.p.A., Milan (IT)

( * ) Notice: Subject to any disclaimer, the term of this patent is extended or adjusted under 35 U.S.C. 154(b) by 0 days.

(21) Appl. No.: 11/578,343

(22) PCT Filed: Mar. 25, 2005

(86) PCT No.: PCT/EP2005/051399

§ 371 (c)(1),
(2), (4) Date: Oct. 12, 2006

(87) PCT Pub. No.: WO2005/101047

PCT Pub. Date: Oct. 27, 2005

(65) Prior Publication Data

US 2007/0273378 A1   Nov. 29, 2007

(30) Foreign Application Priority Data

Apr. 13, 2004   (IT) ................... SV2004A0016

(51) Int. Cl.
*G01V 3/00* (2006.01)
(52) U.S. Cl. .................... 324/318; 324/319
(58) Field of Classification Search ......... 324/300–322; 600/407–455; 335/296–298; 128/653–655
See application file for complete search history.

(56) References Cited

U.S. PATENT DOCUMENTS

| | | | |
|---|---|---|---|
| 5,008,624 A | 4/1991 | Yoshida | |
| 5,207,224 A * | 5/1993 | Dickinson et al. | 600/415 |
| 5,343,580 A | 9/1994 | Bonutti | |
| 5,474,068 A | 12/1995 | Takamori | |
| 5,779,637 A | 7/1998 | Palkovich et al. | |
| 6,023,165 A * | 2/2000 | Damadian et al. | 324/318 |
| 6,373,251 B1 * | 4/2002 | Damadian et al. | 324/318 |
| 6,522,145 B1 * | 2/2003 | Damadian et al. | 324/318 |
| 6,621,267 B1 * | 9/2003 | Damadian et al. | 324/319 |
| 2005/0049491 A1* | 3/2005 | Rezzonico et al. | 600/436 |

FOREIGN PATENT DOCUMENTS

| | | |
|---|---|---|
| DE | 39 09 276 A1 | 10/1989 |
| EP | 0 479 514 A1 | 4/1992 |
| EP | 0 517 452 A1 | 12/1992 |
| EP | 0 793 941 A1 | 9/1997 |
| EP | 0 984 461 A2 | 3/2000 |
| EP | 0 985 934 A1 | 3/2000 |

(Continued)

*Primary Examiner*—Brij B Shrivastav
(74) *Attorney, Agent, or Firm*—Buchanan Ingersoll & Rooney PC

(57) ABSTRACT

A magnet for a Magnetic Resonance Imaging apparatus, said magnet having at last two, preferably three open sides, and delimiting the patient receiving area, said magnet being composed of three yoke elements, i.e. two parallel magnetically permeable elements and one transverse yoke element for connection of said two parallel elements, whereby said magnet has a C shape and wherein, for both of said parallel elements, the terminal portion associated to said transverse connecting element has a transverse wall for connection of said two parallel elements with the transverse element, which has an end step for engagement of a corresponding end of said transverse element.

68 Claims, 12 Drawing Sheets

FOREIGN PATENT DOCUMENTS

| | | |
|---|---|---|
| EP | 0 987 558 A2 | 3/2000 |
| EP | 1 460 443 A2 | 9/2004 |
| JP | 8-339916 A | 12/1996 |
| JP | 2002-315733 A | 10/2002 |
| JP | 2004-65714 A | 3/2004 |

* cited by examiner

NUCLEAR MAGNETIC RESONANCE APPARATUS

This invention relates to a Magnetic Resonance Imaging apparatus, comprising at least: a magnet having at least two pole pieces, between which pole pieces a cavity is formed for containing at least one body under examination, which cavity is open on at least one side, and at least one magnet support structure.

Magnetic Resonance Imaging apparatuses are known to be quite heavy, whereby rotary handling of the magnet is often difficult. The magnet is often required to be rotated for examinations which could not be easily performed on patients with limited mobility or on certain body parts. Thus, the magnet must be easily rotated to positions other than the normal horizontal patient position, either through a few degrees or through rotation angles greater than 90°.

Therefore, there is a need to provide a Magnetic Resonance Imaging apparatus which features a very simple construction and a high strength and safety. In addition to being bulky, Magnetic Resonance Imaging apparatuses are also known to be quite heavy, which poses serious magnet handling problems, as well as related safety drawbacks. An accidental and uncontrolled rotation of the magnet might have dangerous effects both for the patient under examination and for any operator moving in the operating range of the apparatus.

The object of this invention is to provide a magnet for a Magnetic Resonance Imaging apparatus, which might simply and inexpensively obviate the drawbacks of prior art Magnetic Resonance Imaging apparatuses, thereby providing a simple, inexpensive and reliable, as well as highly fail-safe apparatus.

The invention fulfils the above objects by providing an apparatus for Nuclear Magnetic Resonance imaging, comprising at least: a magnet having at least two pole pieces, between which pole pieces a cavity is formed for containing at least one body under examination, which cavity is open on at least one side, and at least one magnet support structure, and wherein said magnet may be rotated relative to this support structure.

According to an advantageous embodiment of the inventive apparatus, the magnet rotates about an axis perpendicular to at least one axis of such cavity opening, particularly this axis of rotation essentially passes through the center of the imaging volume of the apparatus, where imaging volume, as used herein, refers to the portion of the magnetic field within the cavity which has optimal characteristics for imaging the body under examination.

In the Magnetic Resonance Imaging apparatus according to a preferred embodiment of the invention, the magnet has a flange in its transverse wall opposite the cavity, for connection with a shaft, the shaft being mounted to a support case in such a manner as to be able to be rotated and translated horizontally, by rotatably and translatably supporting means.

Removable lock/release means are provided between the shaft, which is rotatably and translatably connected to the magnet, and the support case, which allow to change from a magnet rotation condition to a magnet stop condition. According to a non limiting embodiment, the lock/release means are formed, for instance, by two opposed ring gears, whereof one is non rotatably connected to the support case and the other is secured to the shaft in such a manner as to rotate therewith, the two ring gears being mutually engageable and disengageable by axial translational motion of the shaft relative to the case.

The ring gears preferably have front teeth and are maintained in a stable mutual engagement condition thanks to the force exerted by an elastic member, whereas means are provided for moving the two ring gears to a disengagement condition against the action of the elastic member. The elastic member is preferably provided in the form of a Belleville spring, whereas the displacement in the disengagement direction is exerted by an actuator of any type whatever, particularly a hydraulic or pneumatic actuator. Advantageously, the hydraulic actuator is at least partly integrated in the shaft.

Motion can be transmitted to the shaft by providing a shaft handling grip point on the outer surface thereof, which grip is formed by a radial lever, which is itself translatable with the shaft, whereby any magnet translational motion causes a corresponding translational motion of the radial lever. The shaft is supported in the case by bearings, which are preferably placed at the ends of the shaft, and are, for instance, roller bearings.

The radial lever is connected to the end of the rod of a hydraulic or pneumatic rotary cylinder actuator, i.e. a linear actuator, which transmits motion to the shaft.

In one embodiment, the radial lever is coupled to the rod of the actuator by sliding means, which slide in the axial shaft translation direction, e.g. the lever has a thinned perforated terminal, which is mounted on a bar that is held at its ends by a terminal fork for connection with the rod. The fork has such a width that the bar retained thereby is at least as long as or slightly longer than the translation stroke of the shaft. Therefore, a translational motion of the shaft and the associated radial lever does not involve an identical translational motion of the actuator, which stands still with respect to the case, as the radial lever slides on the bar retained by the fork of the linear actuator.

In an alternative embodiment, the linear actuator has a slide guide at its end associated to the support case, for allowing translational motion of the actuator, and the rod of the actuator has one degree of freedom, particularly of rotation, with respect to the radial lever. Hence, as the shaft is translated, it also drives into translation the linear actuator, which follows the shaft by translating on the slide guide that connects it to the support case.

In a further alternative embodiment, the linear actuator is connected to the support case or to the radial lever with the interposition of a joint which allows it to tilt to accommodate the shaft translation. This is possible because such translational motion extends for so little, i.e. in a range of a few millimeters, that the substantial verticality of the linear actuator is not dramatically affected. As an alternative, the radial lever may be designed to have a joint which allows it to tilt relative to the shaft, to accommodate the translational motion of the shaft relative to the actuator.

The ring gears and the Belleville spring may be displaced and stressed in the axial direction of the shaft by hydraulic or pneumatic lock/release displacement means. In a preferred embodiment, the end of the shaft opposite the magnet is provided in the form of a hydraulic or pneumatic lock/release cylinder actuator, whose rod projects out of this end of the shaft, whereas the rod is mounted in such a manner as to be able to rotate relative to the shaft and is alternately subjected to the action of elastic means, which oppose the shaft translation toward disengagement of the ring gear teeth.

The angular position of the shaft and of the associated ring gear relative to the case, and to the associated ring gear may be controlled by sensors and/or photocells and/or encoders which ensure that shaft rotation only stops when the facing teeth of the ring gears are in a proper mutually meshed position. As an alternative thereto or in combination therewith the magnet extreme positions may be also monitored, so that shaft rotation automatically stops when the shaft reaches either extreme position, i.e. when the magnet is in either C- or U-shaped position.

This preferred arrangement provides a Magnetic Resonance Imaging apparatus which has a simple construction and is highly fail-safe, as the magnet may be only released when the two ring gears are moved to a disengagement position and allow free rotation of the magnet. Therefore, the actuation of the linear rotary actuator controls the rotation of the shaft and of the magnet into the desired position. As soon as the desired rotation is completed, the ring gears move back into the contact position, with aligned teeth for proper meshing, and are locked together thanks to the action of the Belleville spring which compresses them against each other, and of the sensors and/or photocells and/or encoders which are possibly provided to monitor the relative positions of the teeth. As pressure is released in the hydraulic lock/release cylinder, in case of a sudden failure of the apparatus or a sudden power failure, the action of the Belleville spring automatically moves the ring gears into a mutual engagement position, thereby causing the magnet to be immediately locked in position, and preventing any uncontrolled or undesired rotation thereof.

A further advantage as compared with prior art apparatuses is that any magnet lock/release and rotation action is performed by linear actuators, which have a simpler construction and ensure a higher reliability at lower costs as compared with normal prior art actuators.

Furthermore, the present invention addresses, separately from or in combination with the above, a magnet for a Magnetic Resonance Imaging apparatus, said magnet having at least two, preferably three open sides, and delimiting the patient receiving area; said magnet being further composed of three yoke elements, i.e. two parallel magnetically permeable yoke elements, and a transverse yoke element for connection of said two parallel elements, whereby said magnet has a C shape.

Such magnets are well-known and widely used. While these magnets satisfactorily serve their function, they still suffer from certain drawbacks. It is well known to the skilled person that magnet structures of Magnetic Resonance Imaging apparatuses are quite heavy and pose problems in rotary handling of magnets. An important characteristic of magnet structures is that they generate a highly homogeneous magnetic field between the pole pieces in at Least a portion of the overall volume of the cavity delimited by the magnetic structure (i.e. imaging volume). Such high homogeneity is imperatively required for the images of the body being examined to be as reliable as possible. Therefore, the relative position of the pole pieces is a very critical factor, as even the slightest offset from the design relative position of the pole pieces would alter the magnetic field lines, thereby affecting the magnetic field or introducing inhomogeneities therein. In all Magnetic Resonance Imaging apparatuses in which the magnet structure always has the same orientation with respect to gravity, any offset from the ideal position of the pole pieces, caused by gravity or by mutual magnetic attraction between the opposed pole pieces is accounted and compensated for during fabrication.

Such compensation may be performed once and for all, as the magnetic and gravity forces which act in the magnet structure are constant.

However, particularly for essentially C- or U-shaped magnet structures, problems arise when rotating the magnet for the examination of a body in certain positions or of certain body parts. As they rotate, the magnet structure, and particularly the pole piece supporting elements thereof, e.g. the two opposed yoke plates of a C-shaped magnet, change their orientation relative to gravity, therefore the stresses acting thereon also change.

In a C-shaped magnet, which moves from a position in which the opposed pole piece-supporting yoke plates are oriented horizontally into a position in which said yoke plates are oriented vertically, the bending stress exerted by gravity passes from being perpendicular to the pole pieces to being parallel to the surfaces of the pole pieces. Here, the compensations provided during fabrication for the horizontal position will not apply to the rotated magnet, with the yoke plates in the vertical position.

If the magnet is a stationary magnet, mechanical prestress loading may be provided to compensate for bending stresses, but this arrangement is not applicable to a rotating magnet.

This condition becomes intolerable when the magnet, for a number of different reasons, is to be rotated through angles greater than 90°.

The object of this invention is to provide a magnet for a Magnetic Resonance Imaging apparatus, which might simply and inexpensively obviate the drawbacks of prior art magnets, while maintaining both a small size and a light weight of the magnet structure.

The invention fulfils the above objects by providing a magnet for a Magnetic Resonance Imaging apparatus, said magnet having at last two, preferably three open sides, and delimiting the patient receiving area; said magnet being composed of three yoke elements, i.e. two parallel magnetically permeable elements and one transverse yoke element for connection of said two parallel elements; whereby said magnet has a C shape and wherein, for both of said parallel elements, the terminal portion associated to said transverse connecting element has a transverse wall for connection of said two parallel elements with the transverse element, which has an end step for engagement of a corresponding end of said transverse element.

Particularly, in an advantageous embodiment of the inventive magnet, fastener means are provided which are oriented perpendicular to the longitudinal extension of said transverse wall, which fastener means engage the two parallel elements with the transverse element within the raised thickness of the end step. Fastener means are further provided parallel to the longitudinal extension of said transverse wall, which engage the two parallel elements with the transverse element at the end step.

Therefore, the magnet of this invention provides a high strength as well as a highly simple construction.

In order to further improve the strength of the structure, especially when the magnet is intended to be rotated, in a preferred embodiment further reinforcement members are provided in the inwardly facing corners between the parallel elements and the transverse element, fastener means being provided between the reinforcement members and the parallel elements and/or the transverse element, for fastening and holding in position said reinforcement members. The reinforcement members may advantageously be at least one single triangular member for each parallel element, extending essentially along the whole parallel element and transverse element coupling length. Nevertheless, according to an alternative embodiment, the reinforcement member may be formed by one or more reinforcing ribs, preferably having a triangular shape, to provide better magnet weight reduction results. Particularly, an optimal arrangement was found to comprise two triangular reinforcing ribs for each parallel element/transverse element pair.

The fastener means of the parallel elements, of the transverse elements and of the reinforcing ribs may be screw fasteners, which provide accurate, and optimally firm positioning.

The magnet of this invention advantageously and essentially allows to avoid any relative displacement between the parts which compose the magnet so that, even upon rotation, the imaging volume is essentially unaltered and optimal for a proper examination of the body in any position thereof. In fact, the inventive magnet has a highly stable structure, and the deformation of the parts which compose the C-shaped magnet is insignificant.

As an alternative to or in combination with the above, this invention also addresses a magnetic pole piece for a Magnetic Resonance Imaging apparatus, comprising at least one magnetized layer, and at least one magnetically permeable layer or plate.

Image quality is known to be related to the homogeneity and constancy of the magnetic field with time. This is ensured by proper relative positioning of the pole pieces and by the construction and temperature of the latter.

In fact, the pole pieces of a Magnetic Resonance imaging apparatus are composed of several parts, which shall be held in proper mutual positions, even when the magnet, and the pole pieces, are intended to rotate. During rotation, the direction of the gravity force acting on the pole pieces of the magnet changes with respect to the axis of the pole pieces and, as each pole piece is formed by several parts, its components must remain in a constant relative position, regardless of their position relative to the gravity force.

Furthermore, the temperature of the pole pieces must be kept constant, to avoid any magnetic field drift, and any shift of the precession frequency of nuclear spins.

A further object of this invention is to provide pole pieces for a Magnetic Resonance imaging apparatus, which have a simple and sturdy construction, capable of withstanding stresses in several different directions without being deformed and with no relative displacement of the pole piece components.

Yet another object of this invention is to provide pole pieces having optimal arrangements for pole piece heating and temperature monitoring.

The invention fulfils the above objects by providing a pole piece for a Magnetic Resonance Imaging apparatus, which comprises at least one magnetized layer, at least one magnetically permeable layer or plate, wherein said magnetically permeable layer or plate has a substantially circular shape and said magnetized layer is formed by a plurality of adjacent and/or superimposed magnetized blocks, which form a polygon essentially approximating the circular shape of said magnetically permeable plate.

In accordance with a preferred embodiment, the magnetic pole piece for Magnetic Resonance Imaging apparatuses further provides fastener posts for securing the pole piece to the inner face of the corresponding parallel yoke element, which are placed in the margin between the polygon and the circumference approximated by the polygon. Each block has a polygonal, particularly cubical shape or a rectangular section, and together form a polygonal layer with stepped peripheral edges and the fastener posts are placed in the recesses of these stepped peripheral edges.

The posts preferably have a tubular shape and contain a hole for the passage of an associated fastener means, such as a bolt and/or a screw.

The magnetically permeable plate has centering recesses for positioning the posts, wherein corresponding post ends may be introduced. The centering recesses are complementary in size to the outside diameter of the posts and/or to the outside diameter of the associated end of the post. The pole piece support structure also has centering recesses for the associated fastener posts of the pole piece. The fastener posts of the pole piece have a reduced or increased diameter at their free ends, corresponding to the diameter of the associated centering recesses, to act as spacers with a predetermined stable size, the end surfaces of the posts being secured against the corresponding surfaces of the bottom sides of the recesses. Advantageously this arrangement provides a highly sturdy and compact pole piece, which may be easily rotated with no relative displacement of its parts, and no imaging volume alteration.

In this embodiment, a sheet pack is further provided, which is formed by at least one metal sheet with cuts thereon, which is positioned on the surface of the magnetically permeable plate opposite the surface of the plate which is turned toward the magnetized layer. The sheet pack is advantageously placed at a distance from the facing surface of the plate, thereby forming a hollow space therewith. The magnetically permeable plate has a cup shape, having at least one, preferably two peripheral steps, which form a raised edge projecting out of the plate surface facing toward the magnetized layer, so that the sheet pack lies on the bottom of the cup-shaped plate. Suitable housings are advantageously formed in the pole piece for the pole piece heaters and temperature sensors.

Furthermore, the pole piece also houses the cables for the pole piece heaters and temperature sensors. Suitable apertures are formed in the peripheral edges of the pole piece for the passage of the cables for the heaters and/or the temperature sensors, and preferably these apertures are two apertures formed on diametrically opposite locations of the plate.

For heating purposes, at least one or more electric heaters are placed in contact with the plate and/or with the magnetized material and/or with the sheet pack.

In a preferred embodiment, the heaters are placed within the magnetized layer, particularly at least some of the heaters are positioned between adjacent magnetized blocks, to maintain their temperature constant and to provide a more effective heating.

In a further embodiment, the heaters are advantageously placed in areas of the pole piece that may be accessed from outside the pole piece, and be easily serviced and replaced during maintenance, by only removing/reaffixing the covering. Particularly, the heater may be formed by a peripheral heating band extending on the side surface of the pole piece edge. This peripheral heating band may be continuous or discontinuous, depending on construction requirements.

Alternatively thereto or in combination therewith, two flat D-shaped heaters may be provided on the inner flat surface of the pole piece, which provide a uniform heating of the pole piece.

The temperature sensors for monitoring the pole piece temperature are situated level with the plate and/or the magnetized material and/or the sheet pack, to effectively monitor the temperature of the various parts of the pole piece and indicate any abnormal condition.

Particularly, the temperature sensors are positioned level with the magnetized layer and preferably between adjacent magnetized blocks, to be able to effectively monitor the temperature within the layer of magnetized blocks.

In accordance with a preferred embodiment, two of these temperature sensors may be provided, placed inside the pole piece, particularly between the blocks and the sheet pack of the pole piece, in the area that is not directly heated by these two flat D-shaped heaters. Therefore, temperature is sensed in an area that is not directly heated by heaters, whereby a more reliable detection is obtained, the temperature of the whole pole piece being more indicative than the temperature of a portion of it.

Furthermore, the presence of two temperature sensors advantageously avoids the need of dismantling the whole pole piece for sensor replacement, in case of failure or malfunction of one of the two pole pieces. In a prior art apparatus with a single temperature sensor, a failure of the latter requires the whole apparatus to be shut down, the pole piece to be completely dismantled and the faulty temperature sensor to be replaced, whereupon the pole piece has to be reassembled, and the shimming plate has to be recalibrated by repositioning the permanent magnets thereon, to obtain the desired magnetic field homogeneity.

The provision of two temperature sensors, which are typically low-cost parts, allows the apparatus to continue operating normally, in case of failure of a sensor, and to require no expensive and complex operation of pole piece dismantling and reassembly, the whole with little expenses.

This invention also relates, alternatively to or in combination with the above, to a patient support table associated to the lower pole piece or to the lower arm of the C-shaped magnet which forms a Magnetic Resonance Imaging apparatus, which table is slideably associated to the structure of the apparatus by slide guides placed at the sides of the pole piece. These guides allow a fast and safe handling of the patient table or support device, which may slide relative to the surface of the pole piece with which it is associated, and is locked in position when needed. This arrangement allows proper positioning of the patient or the relevant body parts under examination. The provision of lateral slide guides advantageously provides a very compact apparatus, the height of the pole piece and the patient table being unaffected by the thickness of the slide guides, unlike prior art apparatuses, in which slide guides are typically positioned on the pole piece, i.e. between the patient table and the pole piece.

Although many of the features disclosed above are referred to a permanent magnet, some features such as the features of the construction which enables the magnetic structure to rotate can also be provided in combination with a resistive or superconducting magnetic structure. Also the construction of the joke can be provided in combination with means for generating the magnetic field which are resistive or superconducting.

Further characteristics and improvements will form the subject of the annexed claims.

The characteristics of the invention and the advantages derived therefrom will be more apparent from the following detailed description of the accompanying drawings, in which.

Figure 1:
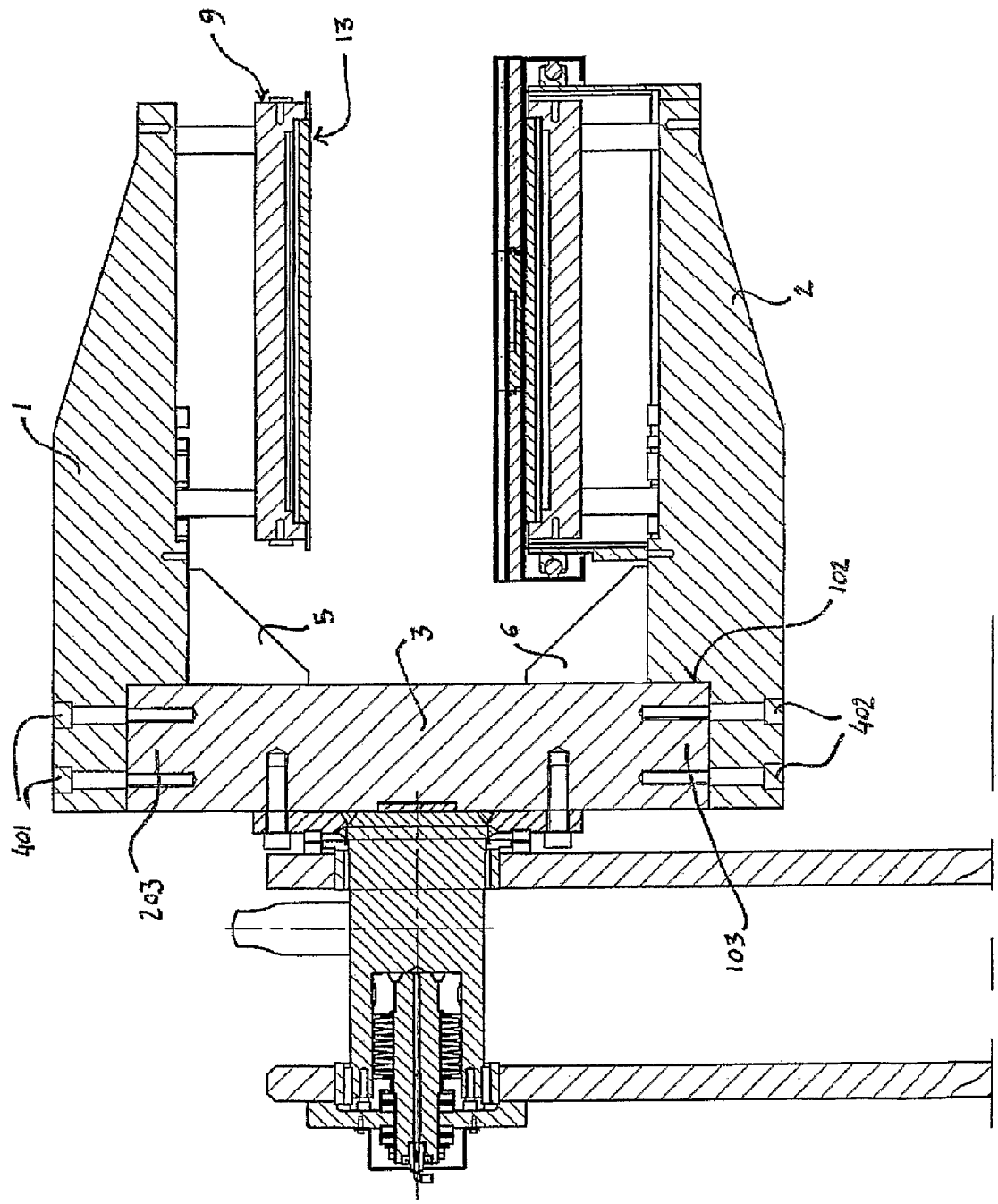
FIG. 1 is a side view of a magnet or magnetic yoke for a Magnetic Resonance Imaging apparatus according to this invention.

Particularly, FIG. 1 shows a magnet for a Magnetic Resonance Imaging apparatus which has three open sides and delimits a patient receiving area. The magnet is composed of three yoke elements, i.e. two parallel magnetically permeable yoke elements 1, 2 and a transverse yoke element 3 for connection of these two parallel elements 1 and 2, whereby the magnet has a C shape.

In an apparatus with an overhangingly supported magnet, which essentially has a C- or laterally inverted U-shape, problems arise when the magnet is required to be rotated.

In a Magnetic Resonance Imaging apparatus whose magnet keeps the same orientation relative to the gravitational field, the displacement of pole pieces is typically not a problem, as the forces acting in the pole piece support members are compensated for during fabrication.

However, when a magnet rotation is required, e.g. for the examination of a body in certain positions or of certain body parts, problems often arise, as the magnet of the apparatus is essentially overhangingly supported by the support structure and is quite heavy. The rotation causes great bending stresses to act on the two arms of the C-shaped magnet, due to the heavy weights being involved. During and after the rotation of the magnet, a situation is generated in which the bending stress causes such deformations that the pole pieces of the magnet are substantially displaced relative to each other, whereby the homogeneity of the magnetic field is altered, and the quality of body images is affected.

More generally, the pole piece support structure may be said to be mainly acted upon by two forces: the gravity force and the force of the magnetic field generated between the pole pieces.

The force of the magnetic field between the pole pieces tends to bend the two arms of the C- or U-shape toward each other and is not affected by the spatial arrangement of the support structure, but remains essentially constant regardless of the spatial arrangement and the rotation of the apparatus.

However, the gravitational force is directed downwards, as is known, and causes different stresses on the structure depending on the position of the support structure, i.e. generally the magnetic yoke. In fact, when the two arms of the C shape are one above the other, with vertically superimposed pole pieces, the force of the gravitational field acts in such a manner that the upper arm tends to bend downwards, whereas the lower arm tends to move toward the floor. In case of a 90° rotation, when the arms of the C shape are in side-by-side positions, gravity-induced stresses cause both arms to deform toward the floor in the same direction. All intermediate positions of the magnet, between the two above mentioned extreme conditions, cause a dramatic change of the stresses acting on the arms of the C-shape.

These two forces, i.e. the force of the gravitational field and the force of the magnetic field sum up during normal operation and generate a variable stress depending on which position is taken by the magnet: if the arms of the C shape are one above the other, the force of the magnetic field tends to partly compensate for the gravity force, thereby reducing the stress on the lower arm of the C shape. After a 90° rotation, the force of the magnet field has no effect on the gravity force, as it acts perpendicular thereto, whereby two deformations along perpendicular planes are produced: the gravity force causes a downward deformation on the vertical plane, whereas the magnetic force acts on the horizontal plane, and draws the two arms of the C shape toward each other.

For a magnet that is not intended to be rotated, a compensation for the above deformations may be attempted during design and fabrication, e.g. by a construction which preventively accounts for the expected magnet deformation, or by the well-known shimming mechanism, which corrects the magnetic field and makes it uniform and parallel even in case of non homogeneous and parallel lines of flux, due to the gravitational force and the magnetic field force.

Furthermore, for weight withstanding purposes, prior art overhangingly mounted apparatuses which are not designed for rotation are often loaded in a mechanical pre-stress condition, a bending stress essentially contrary to the stress that the apparatus is expected to receive in the assembled condition being induced by suitable design and assembly arrangements, to limit the deformation of the apparatus after installation.

The arrangements used in prior art for non rotating magnets are not applicable to rotating magnets, as even the slightest rotation of a C-shaped magnet causes an overall change of the mechanical stress conditions, as mentioned above.

Therefore, a prior art apparatus with a rotating C-shaped magnet often has the drawback of providing either a small imaging volume or a low image quality.

As shown in FIG. 1, in both parallel elements 1, 2, the end portion associated to the transverse connection element 3 has a transverse wall for connecting the two parallel elements with the transverse element 3, which has an end step 101, 102, for engagement of a corresponding end 103, 203, of the transverse element 3.

Figure 2:
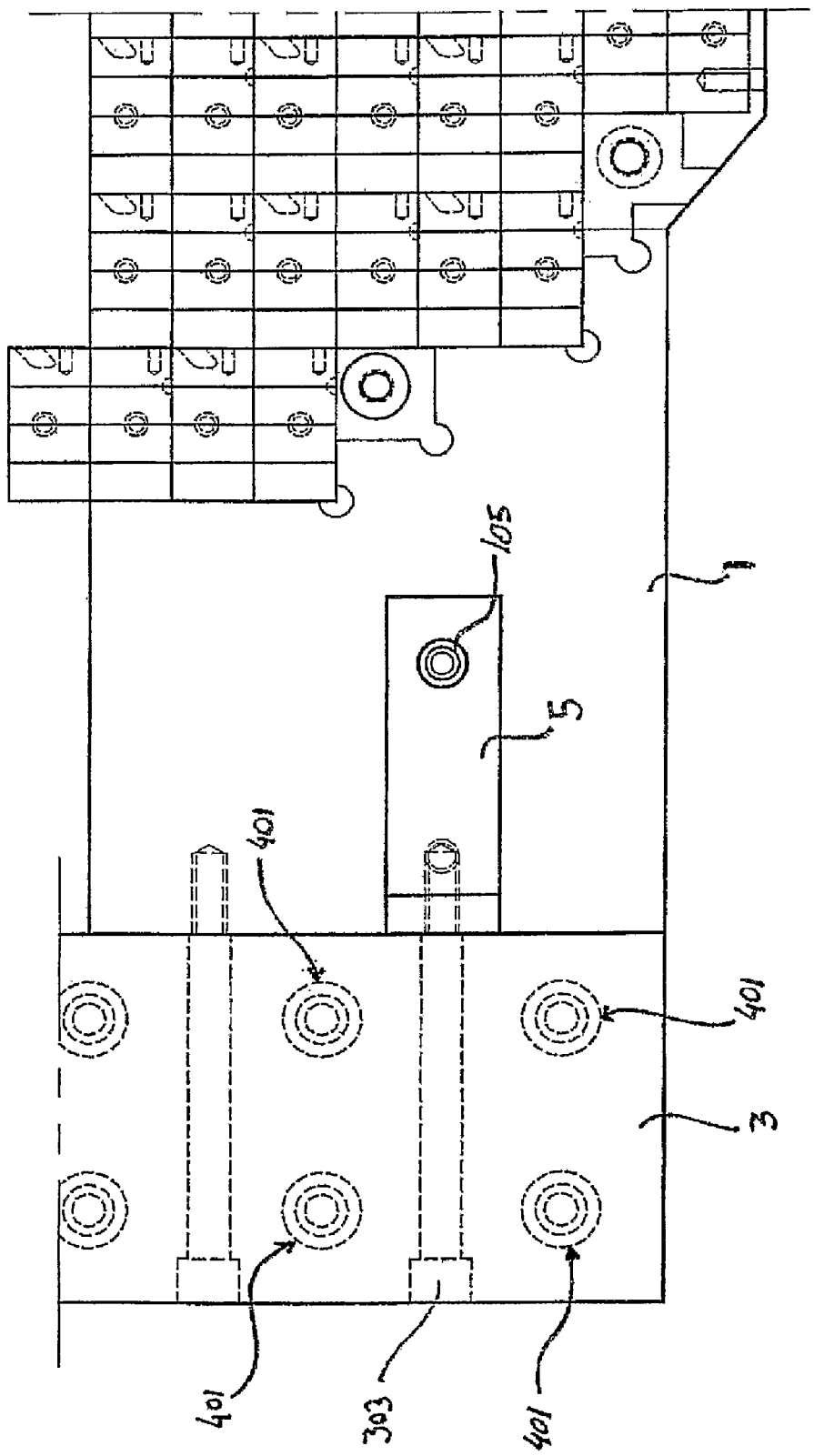
FIG. 2 is a plan view of a portion of a magnet or magnetic yoke for a Magnetic Resonance Imaging apparatus according to this invention.
Figure 3:
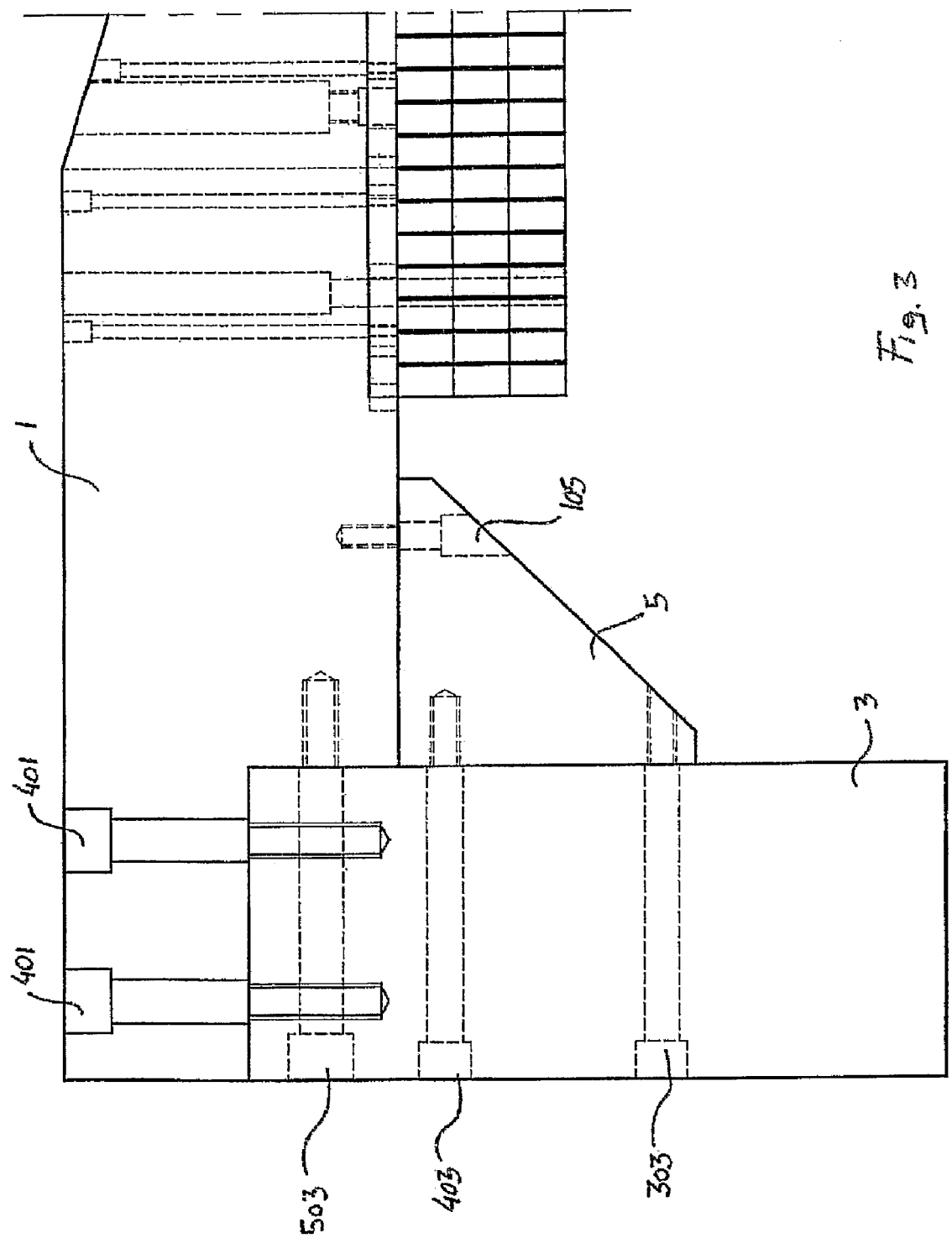
FIG. 3 is a side view of a detail of a magnet or magnetic yoke for a Magnetic Resonance Imaging apparatus according to this invention.

The elements 1 and 2, which are perpendicular to and overhangingly supported by the transverse element 3 are secured thereto by suitable fastener means 401, 402, which are oriented perpendicular to the longitudinal extension of the transverse wall 3 and engage the two parallel elements 1, 2 with the transverse element 3 in the raised thickness of this end step 101, 102. Referring now to FIGS. 1, 2, 3, further fastener means 503 are shown which are oriented parallel to the longitudinal extension of the transverse wall 3, and engage the two parallel elements 1, 2 with the transverse element 3 at the end step 101, 102.

The fixation between the elements of the C-shaped structure of the magnetic yoke is further reinforced by reinforcement member 5, which are positioned in the inwardly facing corners between the parallel elements 1, 2 and the transverse element 3, and which are retained in position between the parallel elements 1, 2 and the transverse element 3 by fastener means 105, 205.

Particularly, in the preferred embodiment of the Figures, the reinforcement members 5 are each formed by a triangular member and may be provided in a variable number depending on the sturdiness required from the magnet. The weight and rigidity of the structure may be advantageously varied by providing a single triangular member 5 extending essentially along the whole parallel element and transverse element coupling length, or one or more preferably triangular reinforcement ribs 5, 6, which have a definitely lighter weight.

Particularly, in a preferred embodiment, two triangular reinforcement ribs are provided for each parallel element/transverse element pair, which is a good compromise between rigidity and lightness of the assembly.

The fastener means are preferably provided in the form of screw fasteners, preferably having a head with a greater diameter than the cylindrical shank of the screw. Thus, the various parts of the magnet may be conveniently centered and assembled in the proper position.

If the magnet, and therefore the pole pieces of a Magnetic Resonance Imaging apparatus are intended to be rotated, the pole pieces shall be constantly in a proper relative position, to form a highly homogeneous magnetic field and provide high quality images. For a rotating magnet, there is the risk that, as the direction of the gravity force on the magnetic yoke changes, due to the heavy weight of the latter and to the overhanging support of its parallel elements, small displacements may occur between the parallel elements and between the pole pieces, thereby causing unevenness and dishomogeneity of the magnetic field.

In all Magnetic Resonance Imaging apparatuses in which the magnet structure always has the same orientation with respect to gravity, any offset from the ideal position of the pole pieces, caused by gravity or by mutual magnetic attraction between the opposed pole pieces is accounted and compensated for during fabrication.

However, a magnet according to the present invention assures that no or almost no relative displacement occurs between parallel elements, and between the pole pieces, whereby the magnetic field remains uniform and homogeneous even when the magnet is rotated, and assures that the image of the body under examination has a good quality.

The magnet of this invention advantageously and essentially allows to avoid any relative displacement between the parts which compose the magnet so that, even upon rotation of the magnet, the magnetic field is essentially unaltered and optimal for a proper examination of the body in any position thereof, at least in the imaging volume. The structure is highly stable, and the deformation of the parts which compose the C-shaped magnet is insignificant.

Figure 11:
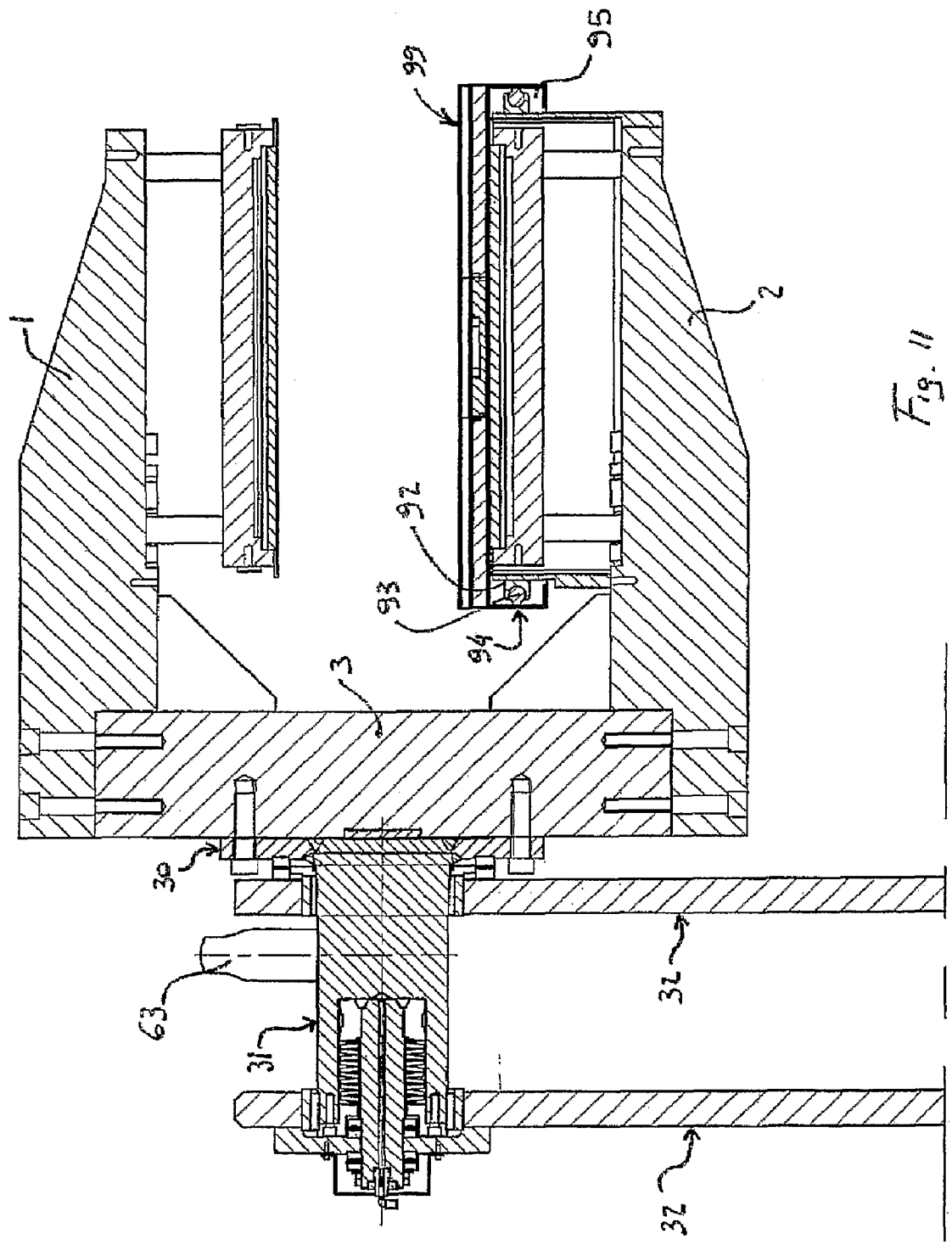
FIG. 11 is a side view of a Magnetic Resonance Imaging apparatus according to this invention.
Figure 12:
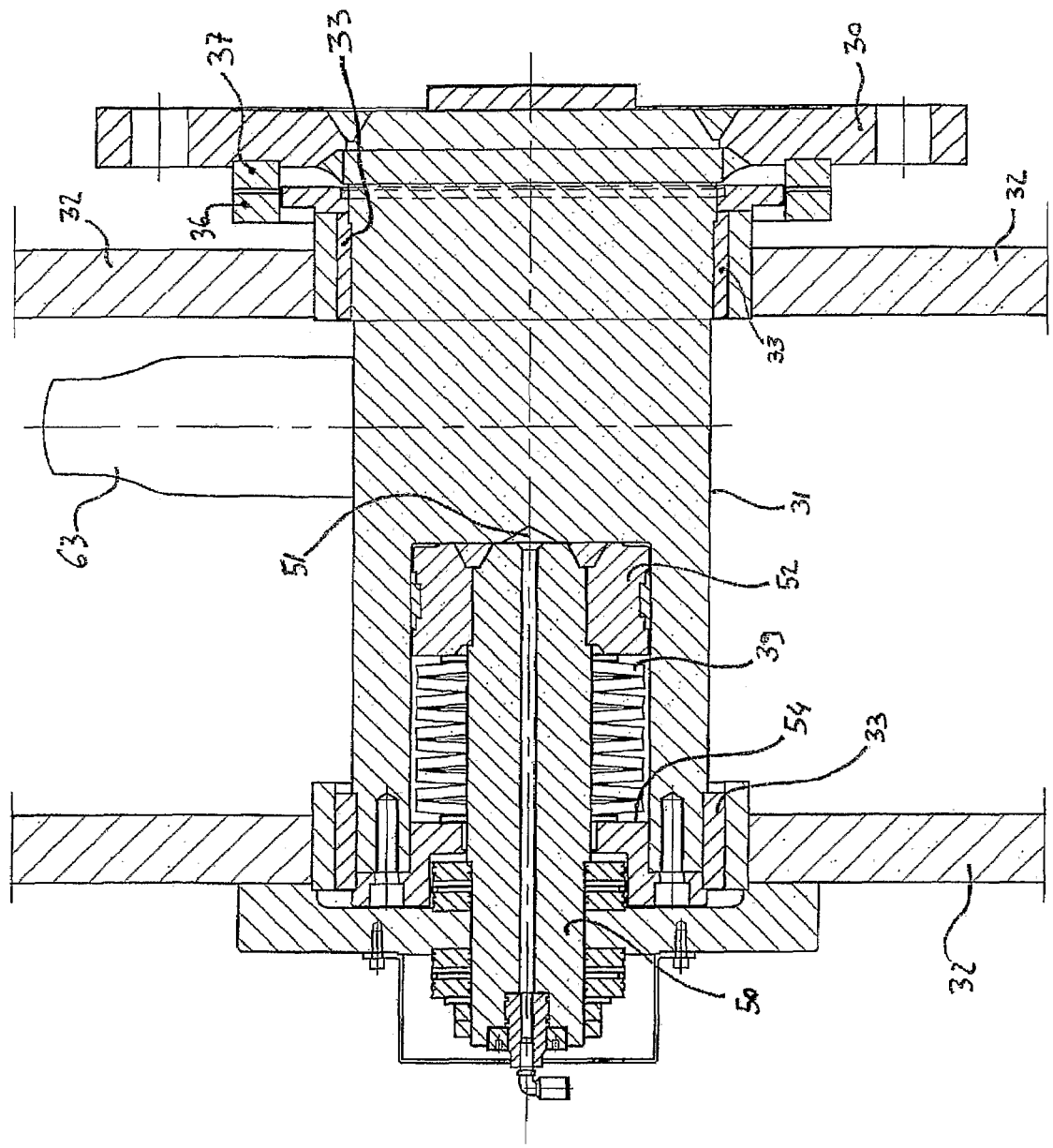
FIG. 12 is a side view of a construction detail of a Magnetic Resonance Imaging apparatus according to this invention.
Figure 14:
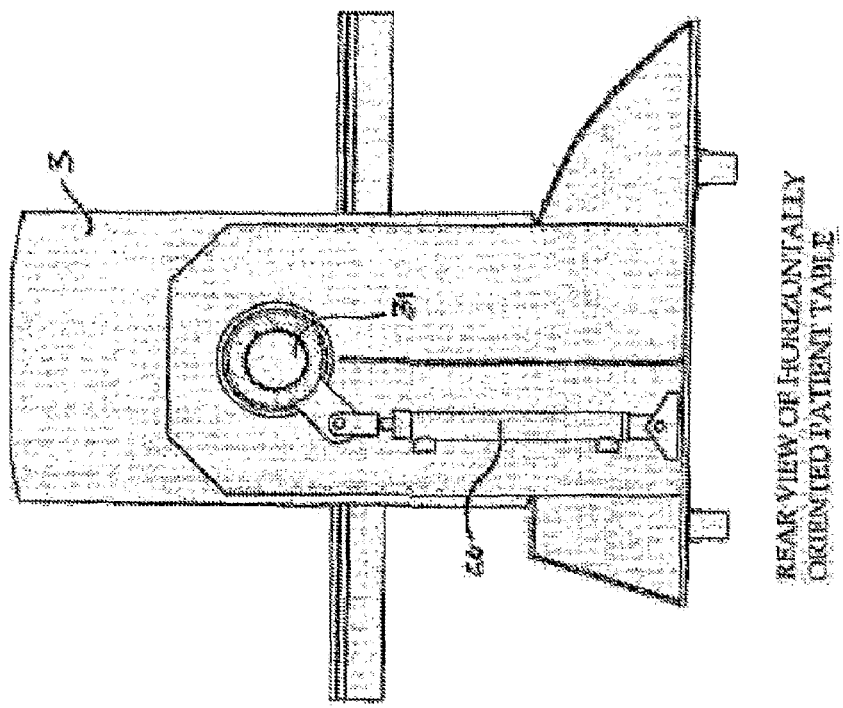
FIG. 14 is a rear view of a Magnetic Resonance Imaging apparatus according to this invention, with the two pole pieces on the same vertical plane.
Figure 13:
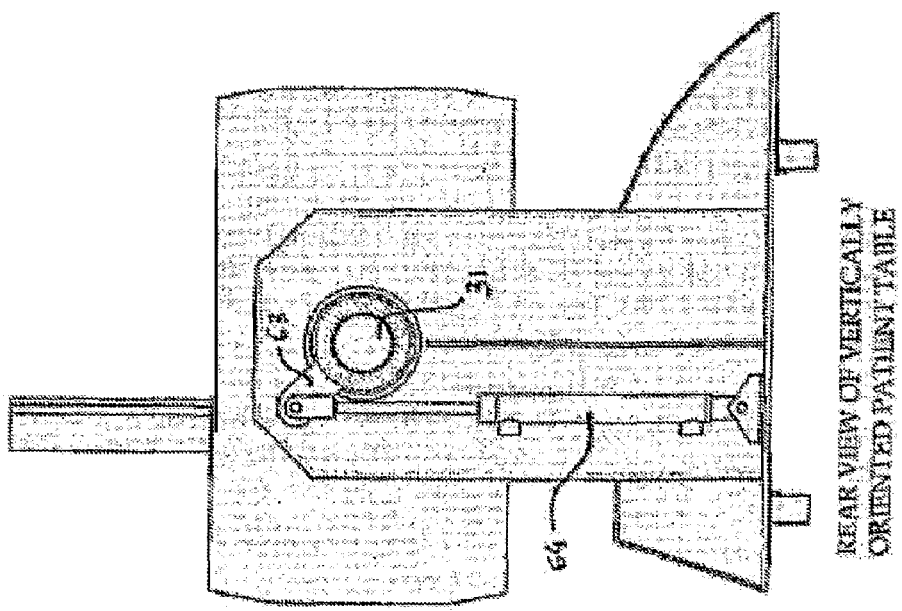
FIG. 13 is a rear view of a Magnetic Resonance Imaging apparatus according to this invention, with the two pole pieces on the same horizontal plane.

According to a further characteristic of this invention, as shown in FIGS. 11 and 12, the magnet is rotatably handled about an axis perpendicular to at least one axis of the cavity opening, particularly in the preferred arrangement of the figures the axis of rotation essentially passes through the center of the imaging volume of the apparatus, where imaging volume, as used herein, refers to the portion of the magnet-defined cavity in which the magnetic field has the best characteristics for imaging the body under examination.

In order that the magnet may be rotated about the preferred axis, it has a coupling flange 30 in its transverse wall opposite the cavity, for coupling the shaft 31 to the transverse wall of the magnet, said transverse wall being rotatably mounted to a support case 32 on rotatably and translatably supporting means 32, such as slide/rotary guides and/or roller bearings.

The coupling flange 30 and the support case part 32 have mutually cooperating lock/release means for locking/releasing the rotation, which allow to change from a magnet rotation condition to a magnet stop condition.

The means for locking/releasing the magnet are provided in the form of two opposed and interconnected ring gears 36, 37, whereof one is integral with the support case 32 and does not rotate, and the other is integral with the shaft 31 and rotates therewith. The ring gears are maintained in a stable mutual engagement condition by the force exerted by an elastic member, and means are provided for moving the two ring gears to a disengagement condition against the action of the elastic member 39.

Particularly, according to a preferred embodiment, the elastic member is provided in the form of a Belleville spring, which ensures a highly strong attachment, adapted to maintain the two ring gears in a mutual engagement condition.

The ring gears 36, 37 preferably have front teeth, which provide a more compact structure and a better and more accurate mesh between the teeth thereof.

As shown in FIG. 12, the ring gear 36 associated to the shaft 31 is integral with the coupling flange 30 and its teeth are directed opposite the magnet.

While the magnet is moving, its rotary motion is transmitted to the shaft 31 by a shaft handling grip, which is formed by a radial lever 63 which is rotatably and/or translatably integral with the shaft; this lever is articulated to the rod of a hydraulic or pneumatic cylinder actuator 64, i.e. a linear actuator, which generates a rectilinear motion, to be turned into a rotary motion of the shaft by the action of the radial lever.

The shaft 31 is preferably associated to the support case 32 by means of roller bearings, which are preferably placed at the ends of the shaft.

The linear actuator is itself connected by its lower portion to the case and, depending on the desired embodiment, may be stationary or translatable on a suitable guide with respect to it.

Figure 15:
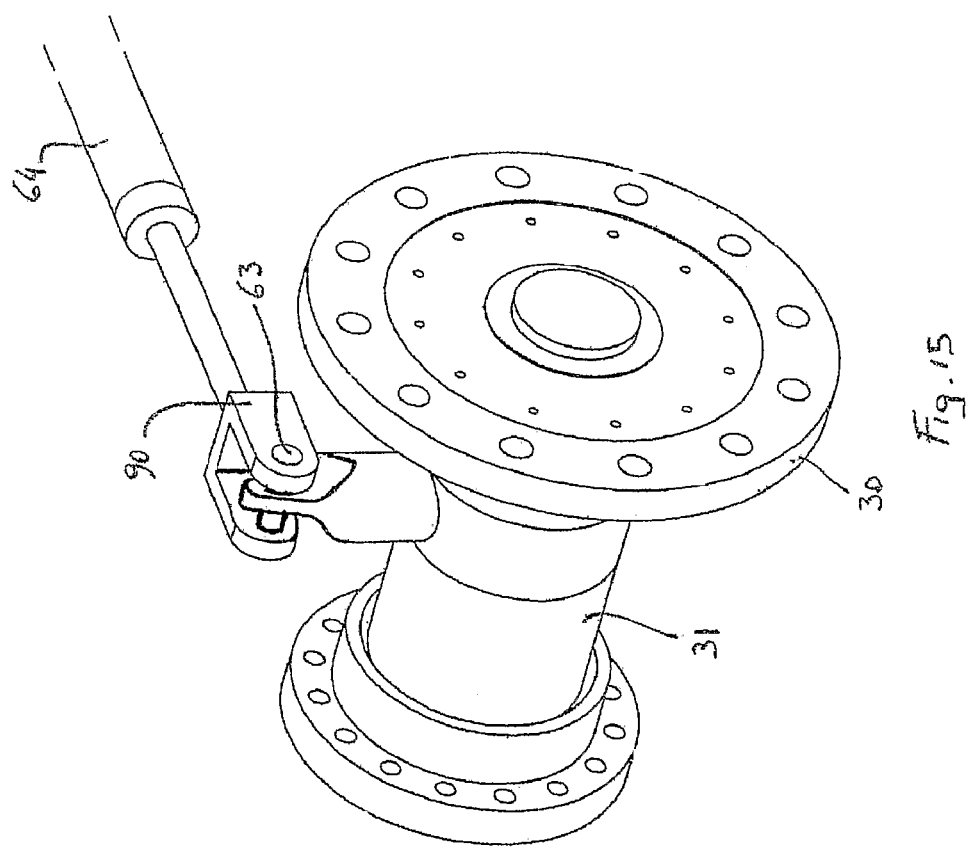
FIG. 15 is a perspective view of a shaft for a Magnetic Resonance Imaging apparatus according to this invention.

In one embodiment, the radial lever 63 is coupled with the rod of the actuator 64 by sliding means, which slide in the axial shaft translation direction, e.g. the lever has a perforated and thinned terminal, as shown in FIG. 15 which is mounted on a bar that is held at its ends by a terminal fork 90 for connection with the rod. The fork 90 has such a width that the bar held thereby is at least as long as or slightly longer than the translation stroke of the shaft. Therefore, a translational motion of the shaft and the associated radial lever does not involve an identical translational motion of the actuator, which stands still with respect to the case, as the radial lever 63 slides on the rod which is retained by the fork 90 of the linear actuator 64.

In an alternative embodiment, the linear actuator has a slide guide, not shown, at its end associated to the support case, for allowing translational motion of the actuator, and the rod of the actuator has one degree of freedom, particularly of rotation, with respect to the radial lever. Hence, as the shaft is translated, it also drives into translation the linear actuator, which follows the shaft by translating on the slide guide that connects it to the support case.

In a further alternative embodiment, the linear actuator is connected to the support case or to the radial lever with the interposition of a joint which allows it to tilt to accommodate the shaft translation. This is possible because such translational motion extends for so little, i.e. in a range of a few millimeters, that the substantial verticality of the linear actuator is not dramatically affected. As an alternative, the radial lever may be designed to have a joint which allows it to tilt relative to the shaft, to accommodate the translational motion of the shaft with respect to the actuator.

As shown in FIGS. 11 and 12, the ring gears 36, 37 and the Belleville spring 39 may be respectively displaced by hydraulic or pneumatic displacement means, and may be stressed thereby in the axial direction of the shaft 31.

Moreover, as shown in FIGS. 11 and 12, the end of the shaft 31 opposite the magnet is provided in the form of a hydraulic or pneumatic lock/release cylinder actuator, whose rod 50 projects out of the end of the shaft 31, and is mounted in such a manner as to be unable to rotate relative to the shaft 31 and is alternately subjected to the action of elastic means, such as the Belleville spring 39, which oppose the shaft translation toward disengagement of the ring gear teeth. The end of the shaft 31 opposite the magnet has a coaxial dead recess, which acts as a chamber 51 for a hydraulic or pneumatic lock/release cylinder actuator, and receives a piston 52 therein, which is mounted at the inner end of the rod 50, whereas the cylindrical recess is tightly closed by an end portion 54 at the head of the shaft, a spring 39 being provided between the piston 52 and the end portion 54, whereas the piston 52 tightly projects out of this end portion.

Therefore, when the magnet has to be rotated, the chamber of the lock/release actuator cylinder is, for instance, filled with oil whereby the Belleville spring is stressed in the compression direction by the hydraulic lock/release actuators. This causes the shaft to be translated relative to the support case, and particularly, in the embodiment of FIG. 12, the shaft moves toward the magnet, thereby bringing the ring gear 37 integral with the magnet and with the shaft, to disengagement from the ring gear 36 integral with the support case 32. This releases the rotation of the magnet connected to the shaft, which is driven by the radial lever moved by the linear actuator. Once the rotation of the magnet is completed, the Belleville spring is released and brings the ring gears 36 and 37 into a mutual engagement position, thereby actually locking the rotation.

The relative position of the rotating shaft and the case may be controlled by sensors and/or photocells which ensure that shaft rotation only stops when the facing teeth of the ring gears 36 and 37 are in a proper mutually meshed position, so that meshing occurs with no shocks or undesired small rotations. As an alternative thereto or in combination therewith the magnet extreme positions may be also monitored, so that shaft rotation automatically stops when the shaft reaches either extreme position, i.e. when the magnet is in either C- or U-shaped position.

This preferred arrangement provides a Magnetic Resonance Imaging apparatus which has a simple construction and is highly fail-safe, as the magnet may be only released when it is stressed by the lock/release piston which moves the two ring gears into disengagement and allows free rotation of the magnet. Hence, in case of a sudden failure of the apparatus or a sudden power failure, the action of the Belleville spring automatically moves the ring gears into a teeth mesh position, thereby causing the magnet to be immediately locked in position, and preventing it from uncontrollably and undesirably rotating.

A further advantage as compared with prior art apparatuses is that any magnet lock/release and rotation action is performed by linear actuators, which have a simpler construction and ensure a higher reliability at lower costs as compared with normal prior art actuators.

Figure 4:
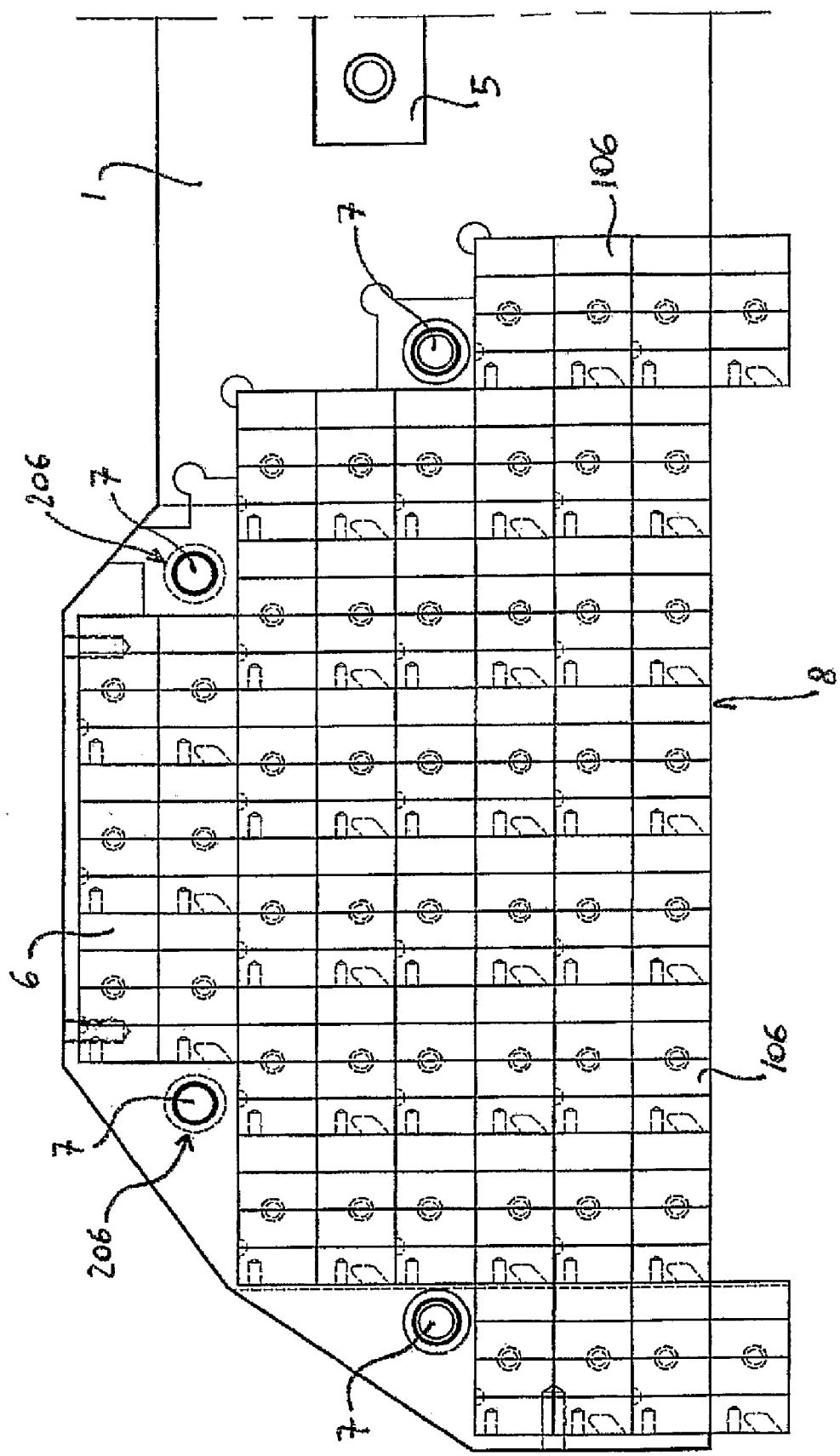
FIG. 4 is a plan view of a magnetic pole piece for a Magnetic Resonance Imaging apparatus according to this invention.
Figure 5:
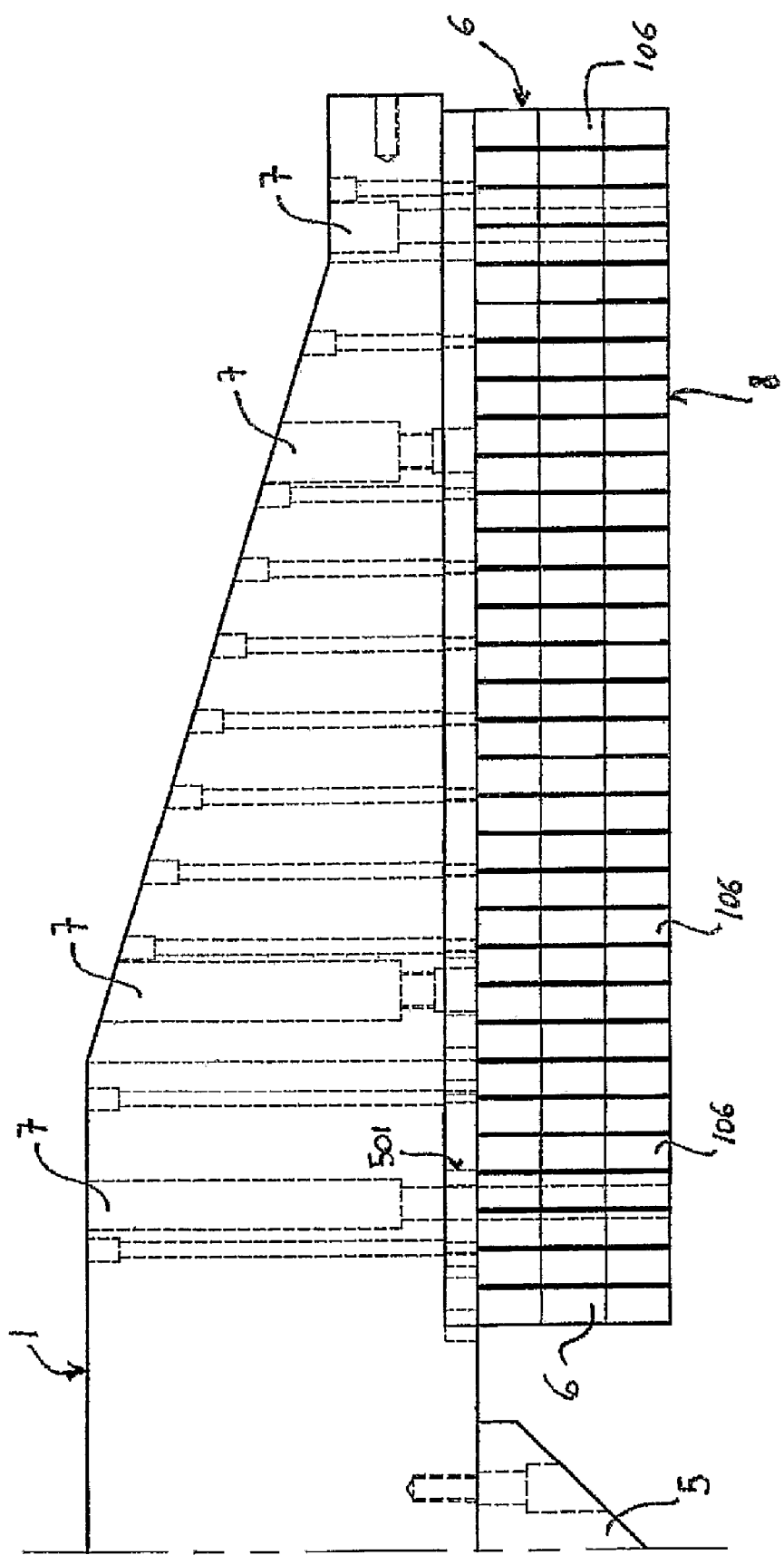
FIG. 5 is a side view of a portion of a magnetic pole piece for a Magnetic Resonance Imaging apparatus according to this invention.
Figure 6:
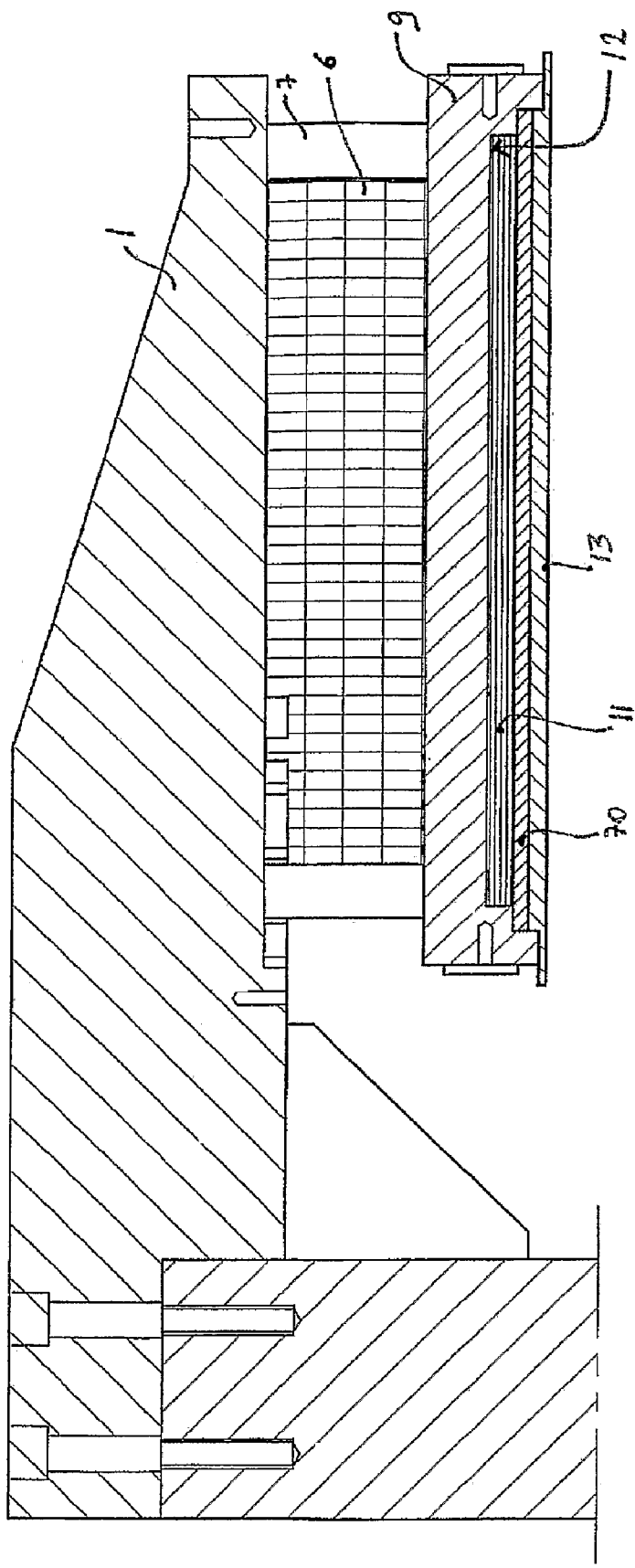
FIG. 6 is a further side view of a magnetic pole piece for a Magnetic Resonance Imaging apparatus according to this invention.

In another preferred embodiment, each pole piece as shown in FIGS. 4 to 6 comprises at least one magnetized layer 6, at least one magnetically permeable layer or plate 9, wherein the magnetically permeable plate 9 has a substantially circular shape and said magnetized layer 6 is formed by a plurality of adjacent and/or superimposed magnetized blocks 106, which form a polygon essentially approximating the circular shape of the magnetically permeable plate 9.

FIG. 4 shows fastener posts 7 for securing the pole piece 8 to the inner face of the corresponding parallel yoke element 1, 2, which are situated in the margin between the polygon and the circumference approximated by the polygon. The fastener posts 7 are placed in the recesses of the stepped peripheral edges formed by the blocks 106, which have a polygonal, particularly cubical shape or a rectangular section, and together form a polygonal layer with stepped peripheral edges.

The posts 7 preferably have a tubular shape and are placed in centering recesses 206 for positioning the posts 7, wherein corresponding post ends may be introduced, the centering recesses 206 being complementary in size to the outside diameter of the posts 7 and/or to the outside diameter of the associated end of the post 7, to allow proper insertion thereof, and to add rigidity to the assembly. The pole piece support structure also has similar centering recesses 501 on the surface facing toward the pole piece, for the fastener posts 7 of the pole piece. The fastener posts 7 have a tubular shape and contain a hole for the passage of an associated fastener means, such as a bolt and/or a screw. Furthermore the fastener posts 7 of the pole piece have a reduced or increased diameter at their free ends, corresponding to the diameter of the associated centering recesses 206 and/or to the corresponding diameter of the positioning recesses, to act as spacers with a predetermined stable size. The posts are pressed against the corresponding surfaces of the bottom sides of said recesses and actually remain compressed against them.

After a rotation that brings the pole pieces onto the same horizontal plane, the gravity force acts tangentially to the pole piece surface and cause a stress perpendicular to the stress obtained when the pole pieces are disposed on the same vertical plane. The posts that act as spacers and are connected by their end portions in the centering recesses prevent the pole pieces, and the components thereof, from moving relative to each other, as the gravity force changes.

As shown in FIGS. 6 to 9, a sheet pack 11 is provided in the pole piece, which is formed by at least one metal sheet 13 with cuts thereon, which is positioned on the surface of the magnetically permeable plate 9 opposite the surface of the plate which is turned toward the magnetized layer 6 and is used to obtain a more homogeneous magnetic field.

A sheet pack 11 formed by multiple superimposed sheets is preferred. Particularly, as shown, the magnetically permeable plate 9 has a cup shape, having at least one, preferably two peripheral steps, which form a raised edge projecting out of the plate surface turned opposite the magnetized layer 6, so that the sheet pack lies on the bottom 12 of the cup-shaped plate and under the known shimming plate 70 which peripherally lies on the second step, hence at a distance from the bottom of the plate, equaling the thickness of the sheet pack 11. In a preferred embodiment, the pole piece has an electromagnetic shield 13 which is placed in the end portion of the pole piece opposite the magnetized blocks, and over the shimming plate, so that the two electromagnetic shields of the two opposed, facing pole pieces are essentially turned toward the patient table 99.

Figure 7:
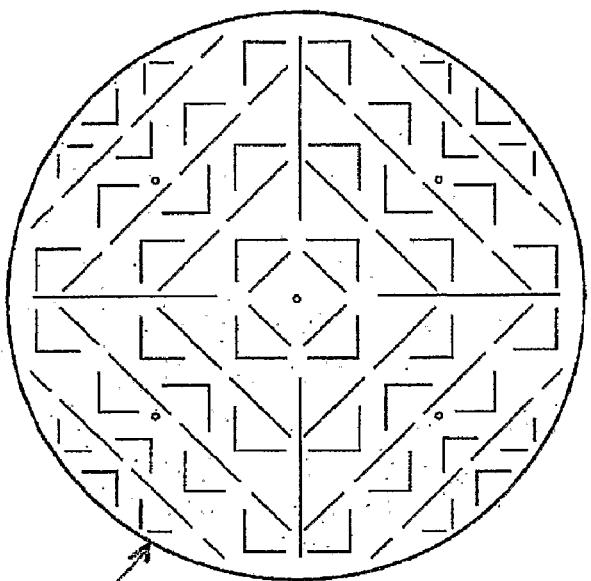
FIGS. 7, 8 are plan views of two types of sheets for a magnetic pole piece for a Magnetic Resonance Imaging apparatus according to this invention.
Figure 8:
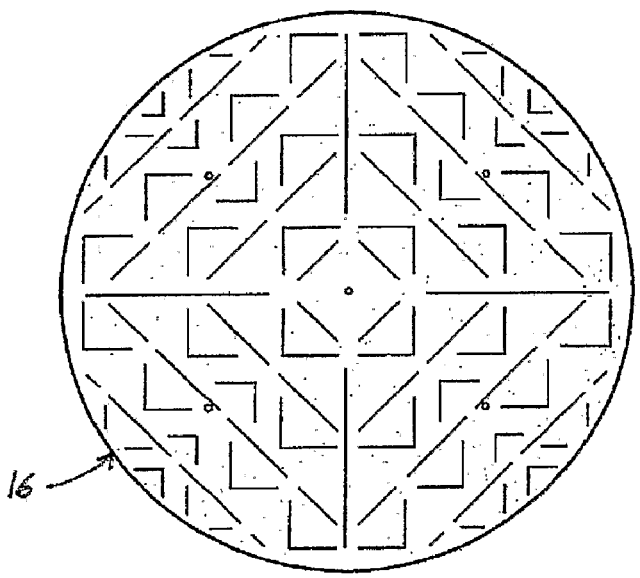
Figure 9:
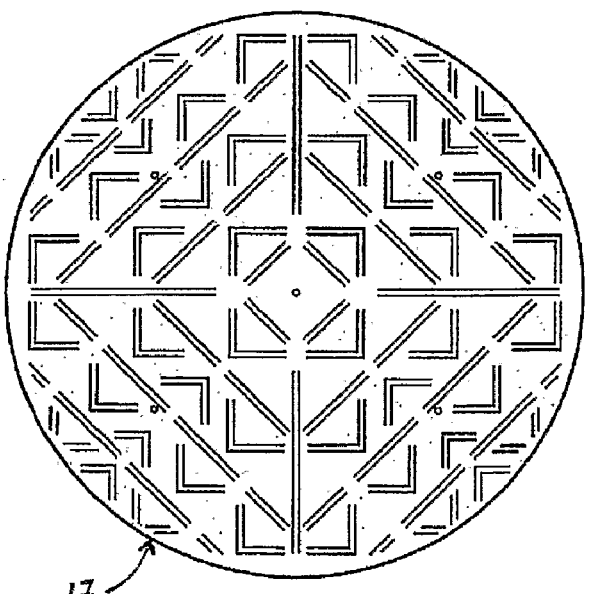
FIG. 9 is a plan view of a sheet pack for a magnetic pole piece for a Magnetic Resonance Imaging apparatus according to this invention.

As shown in FIGS. 7, 8, 9, the sheet pack 11 has a plurality of cuts, the cuts of one sheet being located in different positions with respect to the cuts of the preceding or subsequent sheet in the sheet pack 11. This is achieved by providing that the cuts on each of the metal sheets are essentially non coincident between pair sheets 15 and odd sheets 16, with reference to the sheet positioning order in the sheet pack 11, and preferably the cuts are straight. This arrangement adds homogeneity to the magnetic field.

Moreover, in order to achieve a good image quality, the temperature of the magnetic pole pieces should be maintained constant, as any temperature change might cause an image quality drop.

Thus, a further object of this invention is to provide pole pieces in which pole piece heating and temperature monitoring are optimized, whereby a preferred embodiment provides pole piece heater devices and pole piece temperature sensors; also, the pole piece may be adapted to receive the cables for the pole piece heater devices and temperature sensors. Suitable apertures are formed in the peripheral edges of the pole piece for the passage of the cables for the heaters and/or the temperature sensors, so that the pole piece is as compact as possible.

Figure 10:
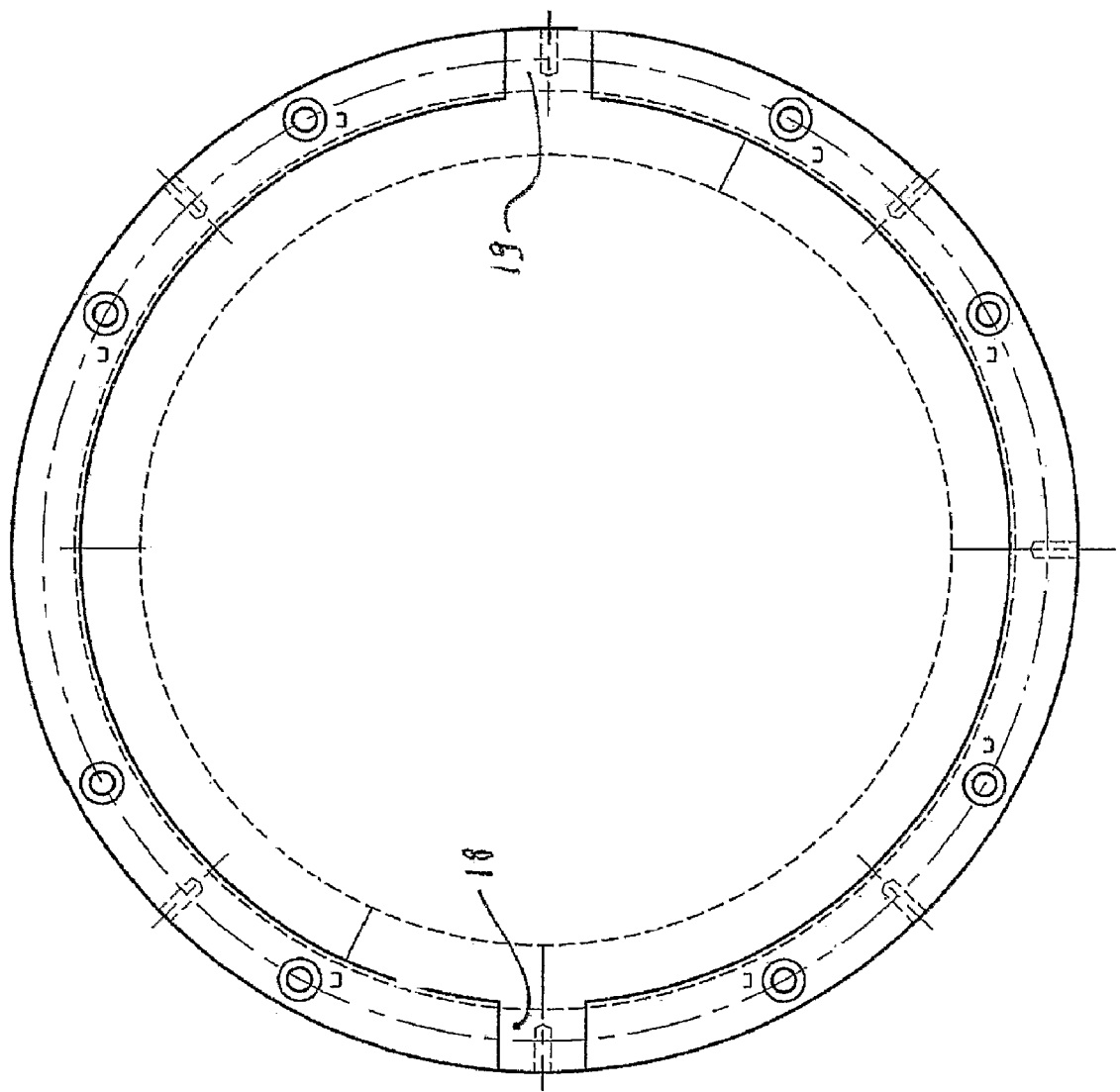
FIG. 10 is a plan view of a plate of a magnetic pole piece for a Magnetic Resonance Imaging apparatus according to this invention.

According to a preferred embodiment, as shown in FIG. 10, the apertures are two passages 18, 19 formed on diametrically opposite locations of the plate 9 to prevent the passage of cables through the pole piece.

Particularly, electrical heaters are provided, which are in contact with said plate 9 and/or with the magnetized material and/or with the sheet pack 11, as shown in the figures.

Furthermore, a particularly capillary and uniform heating arrangement may be provided by positioning at least some of these heaters within the magnetized layer 6 and particularly between adjacent magnetized blocks 106.

Figure 16:
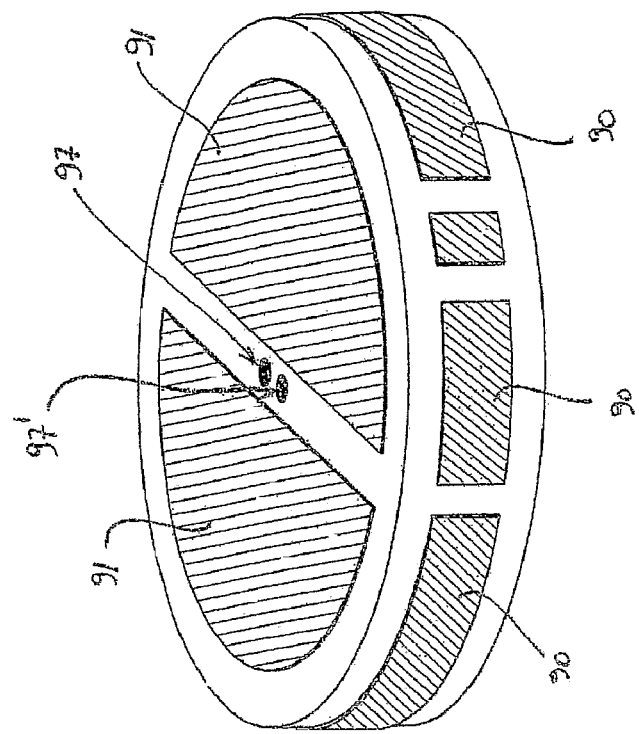
FIG. 16 is a perspective view of a pole piece for a Magnetic Resonance Imaging apparatus according to this invention, where the peripheral heating bands and the two flat D-shaped heaters are visible.

In a preferred embodiment, which is shown in FIG. 16, the heaters may be placed on the externally accessible pole piece surface, which allows easier service and maintenance thereof. Particularly these heaters may be peripheral heaters 90, placed on the peripheral side surface of the edge of the pole piece and are not separate heaters but are provided continuously over the whole peripheral side surface of the pole piece, to form a peripheral heating edge.

Moreover, a more homogeneous heating arrangement may be obtained by providing flat heaters 91 over at least one face of the pole piece, these heaters preferably having the shape of a sector of a circle, more preferably a D shape, and being spaced over the face of the pole piece, to form an area therebetween which is not directly heated, as shown in FIG. 16.

In order that temperature detection and monitoring may be as accurate as possible, the temperature detecting and monitoring sensors 97, as shown in FIG. 16, are positioned within the pole piece, and particularly temperature sensors may be provided level with the plate 9 and/or the magnetized material and/or the sheet pack 11. Furthermore, some of the temperature sensor means may be arranged to be positioned within the magnetized layer 6, preferably between adjacent magnetized blocks 106.

Preferably, there may be two of these temperature sensors 97, 97', placed inside the pole piece, particularly between the blocks and the sheet pack of the pole piece, in the area that is not directly heated by the two D-shaped heaters, as shown in FIG. 16. Therefore, temperature is sensed in an area that is not directly heated by heaters, whereby a more reliable detection is obtained, the temperature of the whole pole piece being more indicative than the temperature of a portion of it.

Also, the provision of two sensors 97 advantageously avoids the need of dismantling and reassembling the pole piece and of subsequently recalibrating the shimming plate, in case of failure of one of the two pole pieces, because, with a very little starting cost, the apparatus may be arranged to continue operating with a single sensor.

Furthermore, the provision of two sensors allows temperature monitoring and detection in particularly difficult areas of the pole pieces, such as the areas of the magnetized blocks, with the highest accuracy, thereby assuring a good image quality.

FIG. 11 further shows the lateral slide guides 95 for the patient table 99 which, in a preferred embodiment, are provided in the form of a vertical support tab 94 which extends toward the pole piece from the sides of the patient table, said support shoulder or tab being associated to a guide and slide combination, which is preferably formed by a longitudinal slide having a cylindrical head 93, cooperating with a concave guide 92 which has a corresponding open profile. Thus the total height of the patient table 99 and the pole piece is considerably smaller than the heights of prior art patient tables and pole pieces, as guides are positioned sideways and the volume does not extend vertically.

The longitudinal slide 93 is overhangingly supported toward the median area of the patient table surface and below said patient table surface by lower side tabs, branching off the two opposite longitudinal sides of the patient table. The guide 92 is carried by the shoulder which is oriented parallel to the slide and/or to the side tabs of the patient table, and this guide is open on the side turned toward the inner face of the tabs which carry the longitudinal slide 93. A guide 92 and slide 93 combination is provided on each longitudinal side of the patient table.

The guide/slide combination may be advantageously provided in the form of a continuous guide which is coupled to a discontinuous slide or vice versa, to further and advantageously reduce the weight of the patient support device, which is intended to rotate with the magnet and therefore must have as light a weight as possible.

The invention claimed is:

1. A magnet for a Magnetic Resonance Imaging apparatus, said magnet comprising:
at least two pole pieces, between which pole pieces a cavity is formed for containing at least one body under examination, wherein said cavity is open on at least one side;
two parallel magnetically permeable yoke elements; and
a transverse yoke element for connection of said two parallel elements, said magnet thus having a C shape,
wherein in both parallel elements, an end portion associated with said transverse connection element has a transverse wall for connecting the two parallel elements with the transverse element, the transverse wall having an end step for engagement of a corresponding end of said transverse element; and
wherein each pole piece includes at least one magnetized layer, and at least one magnetically permeable layer or plate, wherein said magnetically permeable plate has a substantially circular shape and said magnetized layer is formed by a plurality of adjacent and/or superimposed magnetized blocks which form a polygon essentially approximating the circular shape of said magnetically permeable plate.

2. A magnet as claimed in claim 1, further comprising fastener means which are oriented perpendicular to a longitudinal extension of said transverse wall, and which engage the two parallel elements with the transverse element within a raised thickness of said end step.

3. A magnet as claimed in claim 1, further comprising fastener means which are oriented parallel to a longitudinal extension of said transverse wall, and which engage the two parallel elements with said transverse element at said end step.

4. A magnet as claimed in claim 1, further comprising reinforcement members positioned in inwardly facing corners between said parallel elements and said transverse element and fastener means between said reinforcement members and said parallel elements and/or said transverse element for fastening and holding in position said reinforcement members.

5. A magnet as claimed in claim 4, wherein said reinforcement members are formed by at least one single triangular member.

6. A magnet as claimed in claim 5, wherein said triangular member is provided for each parallel element, and extends essentially along the whole parallel element and transverse element coupling length.

7. A magnet as claimed in claim 4, wherein said reinforcement member is formed by one or more triangular reinforcing ribs.

8. A magnet as claimed in claim 7, wherein two triangular reinforcing ribs are provided for each parallel element/transverse element pair.

9. A magnet as claimed in claim 4, wherein said fastener means are provided in the form of screw fasteners.

10. A pole piece for a Magnetic Resonance Imaging apparatus, comprising
at least one magnetized layer;
at least one magnetically permeable layer or plate, wherein said magnetically permeable plate has a substantially circular shape and said magnetized layer is formed by a plurality of adjacent and/or superimposed magnetized blocks, which form a polygon essentially approximating the circular shape of said magnetically permeable plate; and
fastener posts located in a margin between said polygon and said circumference approximated by the polygon, for securing the pole piece to an inner face of a corresponding parallel yoke element.

11. A pole piece as claimed in claim 10, wherein each of said blocks has a cubical shape or a rectangular section such that the blocks form a polygonal layer with stepped peripheral edges, the fastener posts being located in recesses of said stepped peripheral edges.

12. A pole piece as claimed in claim 10, wherein said posts have a tubular shape.

13. A pole piece as claimed in claim 12, wherein said magnetically permeable plate has centering recesses for positioning said posts, wherein corresponding post ends may be introduced, said centering recesses being complementary in size to an outside diameter of the posts and/or to an outside diameter of the associated post end.

14. A pole piece as claimed in claim 13, further comprising a pole piece support structure, centering recesses being provided on the support structure surface facing toward said pole piece, for the associated fastener posts of the pole piece.

15. A pole piece as claimed in claim 10, wherein said fastener posts of the pole piece have a tubular shape and contain a hole for the passage of an associated fastener means, such as a bolt and/or a screw.

16. A pole piece as claimed in claim 14, wherein said fastener posts of the pole piece have a reduced or increased diameter at their free ends, corresponding to a diameter of the associated centering recesses and/or to the corresponding diameter of the positioning recesses, to act as spacers with a predetermined stable size, the end surfaces of said posts being secured against the corresponding surfaces of the bottom sides of said recesses.

17. A pole piece as claimed in claim 10, further comprising a sheet pack, which is formed by at least one metal sheet with cuts thereon, which is positioned on the surface of the magnetically permeable plate opposite the surface of the plate which is turned toward the magnetized layer.

18. A pole piece as claimed in claim 17, wherein said magnetically permeable plate has a cup shape, having at least one peripheral step, which forms a raised edge projecting out of the plate surface opposite the magnetized layer, so that the sheet pack lies on the bottom of the cup-shaped plate.

19. A pole piece as claimed in claim 18, wherein said sheet pack lies under a shimming plate which peripherally lies on a second step, at a distance from the bottom of the plate equaling a raised thickness of the sheet pack, and lying sideways on a raised portion of the second step.

20. A pole piece as claimed in claim 17, wherein each metal sheet of said sheet pack has a plurality of cuts, the cuts of one sheet being located in different positions with respect to the cuts of a preceding or subsequent sheet in the sheet pack.

21. A pole piece as claimed in claim 20, wherein said cuts on each of said metal sheets are essentially straight and non coincident between even sheets and odd sheets, with reference to a sheet positioning order in the sheet pack.

22. A pole piece as claimed in claim 10, wherein pole piece heaters and temperature sensors are housed within said pole pieces.

23. A pole piece as claimed in claim 22, wherein cables for the pole piece heaters and the temperature sensors are housed within the pole piece, suitable apertures being formed in the peripheral edges of said pole piece for the passage of said cables for the heaters and/or said temperature sensors.

24. A pole piece as claimed in claim 23, wherein said apertures are two passages formed on diametrically opposite locations of said plate.

25. A pole piece as claimed in claim 17, wherein at least a few electric heaters are placed in contact with said plate and/or with said magnetized material and/or with said sheet pack.

26. A pole piece as claimed in claim 25, wherein at least some of said heaters are located on externally accessible pole piece surfaces.

27. A pole piece as claimed in claim 25, wherein at least some of said heaters are located within the magnetized layer.

28. A pole piece as claimed in claim 25, wherein at least some of said heaters are located between adjacent magnetized blocks.

29. A pole piece as claimed in claim 26, wherein said heaters located on the externally accessible pole piece surfaces are peripheral band-like heaters positioned on a lateral peripheral surface or edge of the pole piece.

30. A pole piece as claimed in claim 29, wherein said peripheral band-like heaters are continuously positioned all along the lateral peripheral surface of the pole piece.

31. A pole piece as claimed in claim 29, wherein said peripheral band-like heaters are positioned at least partly along the lateral peripheral surface of the pole piece.

32. A pole piece as claimed in claim 25, wherein said heaters are flat heaters located on at least one face of the pole piece.

33. A pole piece as claimed in claim 32, wherein said flat heaters have a D shape resembling sectors of a circle.

34. A pole piece as claimed in claim 33, wherein said flat D-shaped heaters are spaced over the face of the pole piece, to form an area therebetween which is not directly heated.

35. A pole piece as claimed in claim 17, wherein at least two temperature sensors are provided on the same pole piece.

36. A pole piece as claimed in claim 35, wherein said pole piece temperature sensors are located level with said plate and/or with said magnetized material and/or with said sheet pack.

37. A pole piece as claimed in claim 35, wherein at least some of said temperature sensors are located within the magnetized layer, preferably between adjacent magnetized blocks.

38. A Magnetic Resonance Imaging apparatus, comprising:
a magnet having at least two pole pieces, between which pole pieces a cavity is formed for containing at least one body under examination, wherein said cavity is open on at least one side; and
at least one magnet support structure, wherein said magnet is capable of rotating relative to said support structure;
wherein the magnet includes two parallel magnetically permeable yoke elements, and a transverse yoke element for connection of said two parallel elements, said magnet thus having a C shape, wherein in both parallel elements, an end portion associated with said transverse connection element has a transverse wall for connecting the two parallel elements with the transverse element, the transverse wall having an end step for engagement of a corresponding end of said transverse element, and
wherein each pole piece includes at least one magnetized layer, and at least one magnetically permeable layer or plate, wherein said magnetically permeable plate has a substantially circular shape and said magnetized layer is formed by a plurality of adjacent and/or superimposed magnetized blocks which form a polygon essentially approximating the circular shape of said magnetically permeable plate.

39. A Magnetic Resonance Imaging apparatus as claimed in claim 38, wherein the magnet rotates about an axis perpendicular to at least one axis of said cavity opening.

40. A Magnetic Resonance Imaging apparatus as claimed in claim 39, wherein said axis of rotation essentially passes through the center of an imaging volume of the apparatus, and wherein said imaging volume includes a portion of a magnetic field within said cavity which has the best characteristics for imaging the body under examination.

41. A Magnetic Resonance Imaging apparatus as claimed in claim 38, wherein said magnet has a flange in its transverse wall opposite the cavity, for connection between a shaft and said transverse wall of said magnet, said shaft being rotatably mounted to a support case by rotatable and translatable supporting means.

42. A Magnetic Resonance Imaging apparatus as claimed in claim 41, wherein the coupling flange and the support case have mutually cooperating lock/release means for locking/releasing the rotation, enabling a change from a magnet rotation condition to a magnet stop condition.

43. A Magnetic Resonance Imaging apparatus as claimed in claim 42, wherein said lock/release means are provided in the form of two concurrent ring gears wherein one of the ring gears is non rotatably connected to the case and the other is connected to the coupling flange in such a manner as to rotate therewith, said ring gears being maintained in a stable mutual engagement condition by a force exerted by an elastic member, the apparatus further comprising means for moving the two ring gears to a disengagement condition against the force of said elastic member.

44. A Magnetic Resonance Imaging apparatus as claimed in claim 43, wherein said elastic member is a Belleville spring.

45. A Magnetic Resonance Imaging apparatus as claimed in claim 43, wherein said ring gears have front teeth.

46. A Magnetic Resonance Imaging apparatus as claimed in claim 43, wherein the ring gear associated to the flange is integral with the shaft.

47. A Magnetic Resonance Imaging apparatus as claimed in claim 41, wherein the shaft has a shaft handling grip on its outer surface.

48. A Magnetic Resonance Imaging apparatus as claimed in claim 47, wherein said handling grip is a radial lever interposed between said rotatable support means, or bearings.

49. A Magnetic Resonance Imaging apparatus as claimed in claim 41, further comprising at least one radial lever, which is rotatably integral with the shaft, and is articulated to the end of a linear actuator.

50. A Magnetic Resonance Imaging apparatus as claimed in claim 44, wherein the ring gear associated to the shaft by said flange and the Belleville spring are configured to be respectively displaced and stressed in the axial direction of the shaft.

51. A Magnetic Resonance Imaging apparatus as claimed in claim 43, wherein the means for moving one or both ring gears are hydraulic or pneumatic lock/release means.

52. A Magnetic Resonance Imaging apparatus as claimed in claim 43, wherein an end of the shaft opposite the magnet is a hydraulic or pneumatic lock/release cylinder actuator, having a rod that projects out of said end of the shaft, wherein the rod is mounted so as to be able to rotate relative to the shaft and is alternately subjected to the force of the elastic means, which opposes shaft translation toward disengagement from the ring gear.

53. A Magnetic Resonance Imaging apparatus as claimed in claim 43, wherein an end of the shaft opposite the magnet has a coaxial dead recess, which acts as a chamber for a hydraulic or pneumatic lock/release cylinder actuator, a piston being received therein, which is mounted at an inner end of a rod, the cylindrical recess being tightly closed by an end portion at a head of the shaft, and a spring being provided between the piston and said end portion, wherein the piston tightly projects out of said end portion.

54. A Magnetic Resonance Imaging apparatus as claimed in claim 49, wherein the radial lever is coupled with the rod of the actuator by sliding means, which slide in the axial shaft translation direction.

55. A Magnetic Resonance Imaging apparatus as claimed in claim 54, wherein the lever has a perforated and thinned terminal, which is mounted on a bar that is held at its ends by a terminal fork for connection with the rod.

56. A Magnetic Resonance Imaging apparatus as claimed in claim 55, wherein said fork has a width such that the bar held thereby is at least as long as or slightly longer than the translation stroke of the shaft.

57. A Magnetic Resonance Imaging apparatus as claimed in claim 49, wherein the linear actuator has a slide guide at its end associated to the support case, enabling translational motion of the actuator.

58. A Magnetic Resonance Imaging apparatus as claimed in claim 57, wherein a rod of the actuator has one degree of freedom of rotation, with respect to the radial lever.

59. A Magnetic Resonance Imaging apparatus as claimed in claim 58, wherein as the shaft is translated, the shaft also drives into translation the linear actuator, which follows the shaft by translating on the slide guide that connects it to the support case.

60. A Magnetic Resonance Imaging apparatus as claimed in claim 49, wherein the linear actuator is associated to the support case or to the radial lever with the interposition of a joint which allows the linear actuator to tilt to accommodate the shaft translation.

61. A Magnetic Resonance Imaging apparatus as claimed in claim 49, wherein the radial lever has a joint which allows the radial lever to tilt with respect to the shaft, to accommodate the translational motion of the shaft with respect to the actuator.

62. A Magnetic Resonance Imaging apparatus as claimed in claim 38, further comprising a patient support device including guides along which the patient support device may slide with respect to the structure of the associated Magnetic Resonance Imaging apparatus, which are located at the sides of said patient support device.

63. A Magnetic Resonance Imaging apparatus as claimed in claim 62, wherein said guides comprise a vertical support surface which extends from the sides of the patient table toward the pole piece, said support surface being associated to a guide and slide combination.

64. A Magnetic Resonance Imaging apparatus as claimed in claim 63, wherein said guide and slide combination is a slide having a continuous or discontinuous semi-cylindrical head and cooperating with a continuous or discontinuous concave guide which has a corresponding open profile.

65. A Magnetic Resonance Imaging apparatus according to claim 38, wherein the magnet includes permanent magnets or resistive magnetic field generating means or superconducting generating means.

66. A Magnetic Resonance Imaging apparatus according to claim 38, wherein the magnet comprises permanent magnets or resistive magnetic field generating means or superconducting generating means.

67. A Magnetic Resonance Imaging apparatus comprising the pole piece according to claim 10 and permanent magnets or resistive magnetic field generating means or super-conducting generating means.

68. A magnet as claimed in claim 1, wherein a thickness of the two parallel yoke elements is reduced along an edge at which said two parallel elements are connected with the transverse yoke element.

* * * * *